United States Patent [19]
Lahne et al.

[11] Patent Number: 5,642,978
[45] Date of Patent: Jul. 1, 1997

[54] DEVICE FOR HANDLING DISK-SHAPED OBJECTS IN A HANDLING PLANE OF A LOCAL CLEAN ROOM

[75] Inventors: Berndt Lahne; Klaus Schultz; Werner Scheler; Michael Heitmann; Axel Gaglin, all of Jena, Germany

[73] Assignee: Jenoptik GmbH, Jena, Germany

[21] Appl. No.: 656,698

[22] Filed: Jun. 3, 1996

Related U.S. Application Data

[63] Continuation of Ser. No. 331,524, filed as PCT/EP94/00959, Mar. 25, 1994, abandoned.

[30] Foreign Application Priority Data

Mar. 29, 1993 [DE] Germany .................... 43 10 149.6

[51] Int. Cl.⁶ .................................... H01L 21/00
[52] U.S. Cl. .................... 414/331; 414/416; 414/937; 454/187
[58] Field of Search .................... 414/222, 225, 414/331, 217, 416, 937, 939, 940; 454/187

[56] References Cited

U.S. PATENT DOCUMENTS

| | | | |
|---|---|---|---|
| 3,923,342 | 12/1975 | Shannon | 414/331 X |
| 3,972,424 | 8/1976 | Levy et al. | 414/937 X |
| 4,746,256 | 5/1988 | Boyle et al. | 414/217 |
| 4,781,511 | 11/1988 | Harada et al. | 414/940 X |
| 4,867,629 | 9/1989 | Iwasawa et al. | 454/187 X |
| 4,895,486 | 1/1990 | Baker et al. | 414/331 |
| 4,904,153 | 2/1990 | Iwasawa et al. | 414/940 X |
| 4,923,342 | 5/1990 | Kopkie et al. | 409/143 |
| 4,952,299 | 8/1990 | Chrisos et al. | 414/937 X |
| 4,954,721 | 9/1990 | Suzuki | 414/940 X |
| 5,007,784 | 4/1991 | Genov et al. | 414/416 X |
| 5,096,477 | 3/1992 | Shinoda et al. | 454/187 X |
| 5,145,303 | 9/1992 | Clarke | 414/939 X |
| 5,181,819 | 1/1993 | Sakata et al. | 414/217 |
| 5,221,201 | 6/1993 | Yamaga et al. | 414/937 X |
| 5,297,910 | 3/1994 | Yoshioka et al. | 414/416 X |

FOREIGN PATENT DOCUMENTS

| | | |
|---|---|---|
| 0238751 | 9/1987 | European Pat. Off. . |
| 3639991 | 11/1986 | Germany . |
| 3931985 | 9/1989 | Germany . |
| 4215522 | 5/1992 | Germany . |
| 131533 | 6/1988 | Japan .................... 414/937 |
| 44246 | 2/1992 | Japan .................... 414/937 |
| 75362 | 3/1992 | Japan .................... 414/937 |
| 345049 | 12/1992 | Japan .................... 414/940 |
| 208931 | 2/1993 | Japan .................... 414/937 |
| 216325 | 2/1993 | Japan .................... 414/937 |

OTHER PUBLICATIONS

Patent Abstracts of Japan, M-1039, Oct. 24, 1990, vol. 14, No. 488.
Solid State Technology, 33(1990) Aug., # 8 (pp. S1-S5) "Wafer Confinement for Control of Contamination in Microelectronics" (Claude Doche).
Solid State Technology, 29(1986) Dec., # 12 (pp. 61-65) "SMIF System Performance at 0.22μm Particle Size" (Harada, et al).
Extended Abstracts, 88-2 (1988) Fall, Princeton, NJ, # 409 (pp. 599-600) "A SMIF-Vacuum Interface Chamber . . . ".

*Primary Examiner*—David A. Bucci
*Attorney, Agent, or Firm*—McAulay Fisher Nissen Goldberg & Kiel, LLP

[57] ABSTRACT

A device for handling disk-shaped objects in a handling plane of a local clean room has the object of ensuring process steps preceding or following the processing and inspection of the disk-shaped objects under the conditions of a local clean room with the use of SMIF boxes. The handling plane (H—H) is in a fixed constructional relationship with a reference plane (E—E) of at least one device comprising the magazine seat as a component part, which device serves to index the shelves of magazines and disk-shaped objects contained therein and is arranged above an intermediate base dividing the clean room into two partial spaces located one above the other, in which an air flow component of an air flow is directed from the partial space above the intermediate base into the partial space below the intermediate base. The device can be used in the manufacture of integrated circuits, particularly for handling tasks.

13 Claims, 8 Drawing Sheets

DEVICE FOR HANDLING DISK-SHAPED OBJECTS IN A HANDLING PLANE OF A LOCAL CLEAN ROOM

This is a continuation of application Ser. No. 08/331,524, filed on Nov. 3, 1994, now abandoned, which was the national phase application under § 371 of International PCT/EP94/00959, filed Mar. 25, 1994.

BACKGROUND OF THE INVENTION a) Field of the Invention

The invention is directed to a device for handling disk-shaped objects in a handling plane of a local clean room containing a magazine seat which is adjustable vertically relative to the handling plane in a measurable manner and work stations for processing and inspection located substantially in the handling plane. Technical solutions of this kind are applied in the manufacture of integrated circuits, in particular for handling tasks.

b) Description of the Related Art

The increasing degree of integration and reduced design widths in the manufacture of integrated circuits lead to progressively stricter requirements for the quality of clean rooms. In order to meet such requirements, standardized transport containers, so-called standard mechanical interface boxes (SMIF boxes), are increasingly used to transport disk-shaped objects (wafers or masks) to individual processing stations, the cassette or magazine containing the objects in its shelves being fixed in a suitable manner to the base of these transport containers. When loading the processing machines, the magazines are removed from the transporting containers by appropriate means and the objects are taken out by a manipulator. After processing, the objects are returned to the shelves of the magazine and the magazine is replaced in the transport container.

The use of such SMIF boxes was previously restricted primarily only to large devices such as wafer steppers, implanters, etc., so that there is still no general application of such SMIF solutions to a great many process steps at the present time. Often, the magazines holding the objects are removed from the SMIF boxes by more or less complicated devices and transferred manually or automatically to the processing and inspection equipment With the creation of device oriented, self-contained local clean rooms having a defined input/output interface, it has been possible to lower requirements for the surrounding clean room or to improve the quality of the environment of the objects in conventional clean rooms.

U.S. Pat. No. 4,746,256 describes a device for handling and inspecting wafers or masks as disk-shaped objects in a local clean room with SMIF boxes, manipulators and work stations. The manipulators and work stations are enclosed by a self-contained canopy in which the magazine, including the objects, can be introduced and seated after placing the SMIF boxes on the canopy. The manipulator is adjustable in the z axis for removing the objects from various planes of the magazine and for transferring them to the work station.

Further, it is known from U.S. Pat. No. 4,895,486 to determine the presence of wafer-like objects in a carrier (magazine) and their position in the magazine relative to a reference plane by means of a monitoring device in that a first signal for the presence of such an object is coupled with a position signal. The first signal is obtained with the aid of an optoelectronic sensor monitoring the space in which the objects can be located. The second signal is generated by a position encoder coupled with a drive for raising and lowering the magazine. To determine the reference plane and the area in which the objects are seated, the space in the magazine is divided into vertical segments. In addition to a segment serving as reference plane and segments in which no wafer-like objects are found, window segments in which objects may be present are also defined. The magazine is indexed in that the locations of the window segments are determined by computer and stored therein based on information concerning the construction of the magazine used in the given case after detecting the reference plane in the magazine by measuring technique.

Although the solution described above can be used to determine the number of objects and their locations relative to a reference plane within the magazine, the magazine or manipulator must be positioned within the modular dimensions of the magazine in order to remove the objects from the shelves of the latter. Errors will occur if divergent magazine geometries and tolerances are not taken into account. This will result in problems when arbitrarily charging an empty magazine or when rearranging objects within a magazine or from one magazine to another as a preparatory or follow-up process to processing or inspection.

OBJECT AND SUMMARY OF THE INVENTION

It is a primary object of the present invention to safeguard such process steps leading up to or following processing and inspection of the disk-shaped objects under local clean-room conditions with or, at least partially, without the use of SMIF boxes.

This object is met, according to the invention, by a device for handling disk-shaped objects in a handling plane of a local clean room containing a magazine receptacle or seat which can be adjusted vertically relative to the handling plane in a measurable manner and work stations for processing and inspection located substantially in the handling plane in that the handling plane is in a fixed constructional relationship to a reference plane of at least one device containing the magazine seat as a component part, which device serves to index the shelves of magazines and disk-shaped objects contained therein and is arranged above an intermediate base dividing the clean room into two partial spaces located one above the other, in which an air flow component of an air flow is directed from the partial space above the intermediate base into the partial space below the intermediate base.

The air flow produced by an air-processing system is directed on a wall which is located opposite the air-processing system and outwardly defines the clean room. This wall has air outlet openings whose total cross section above the intermediate base is smaller than the total cross section below the intermediate base.

Particles which are introduced below the intermediate base by the drive elements and can adversely affect clean room conditions are prevented from entering the handling, processing, and inspection areas.

In an air-processing system containing an axial fan and a filter arranged in series in the direction of flow between an inlet opening and an outlet opening in a common housing serving as a plenum, the inlet opening and axial fan are advantageously separated by a tubular enclosure from the plenum until an air outlet in the direction of flow. The air outlet contains air guidance surfaces which are situated in the air flow and act against rotational components of the air flow.

The air outlet advantageously comprises circle-sector-shaped cut outs which are cut into a plate connected with the enclosure so as to be symmetrical to the rotational axis of the axial fan, the air guidance surfaces being placed in these cut outs so as to be directed parallel to the fan blades of the axial fan.

The indexing device has an optoelectronic sensor having a transmitter and a receiver which detects the position of the magazine shelves and disk-shaped objects relative to the reference plane by means of measuring techniques.

The transmitter emits a bundle of measurement rays whose center is oriented in the reference plane. This bundle of rays is guided between oppositely located walls containing the magazine shelves and is directed on and interrupted by projections of one of the walls, which projections face toward the interior of the magazine and form shelves supporting the disk-shaped objects. As a result of the vertical adjustment in the direction of the magazine shelves which are located one above the other and which accordingly successively occupy a position in common with the reference plane, an image of the magazine shelves and of the disk-shaped objects located therein is produced by modulating the bundle of measurement rays.

The magazine shelves themselves and the objects contained therein are detected with measuring techniques by an individual sensor system so as to determine actual ratios as distinct from determining the position of a magazine shelf by computer based on constructional data or determining position with reference to an indexing scale. In this way, loading and unloading may be carried out optionally so as to enable any type of rearrangement between magazines with different shelf spacing relative to a reference plane within the magazine. Empty magazines can also be filled as desired.

A wafer returning device is provided for positioning disk-shaped objects protruding from the magazine. The action of the wafer returning device depends on a sensor signal of a second sensor whose bundle of measurement rays is directed parallel to the disk-shaped objects and directly adjoins the side of the magazine used for loading and unloading during vertical adjustment of the magazine.

When triggered by the sensor signal, the wafer returning device returns the object to the magazine shelf without requiring external intervention so as to ensure the continued transport of the magazine in the transport containers and prevent damage to protruding objects.

A manipulator with an articulated arm having a plurality of members is used for handling. The rotating axles of the articulated arm are formed by hollow axles and its front member has a vacuum holding device for picking up the disk-shaped objects. The vacuum holding device is directly connected with a vacuum in the hollow axles.

The invention will be explained in more detail in the following with reference to the schematic drawings.

DESCRIPTION OF THE PREFERRED EMBODIMENTS

Figure 1:
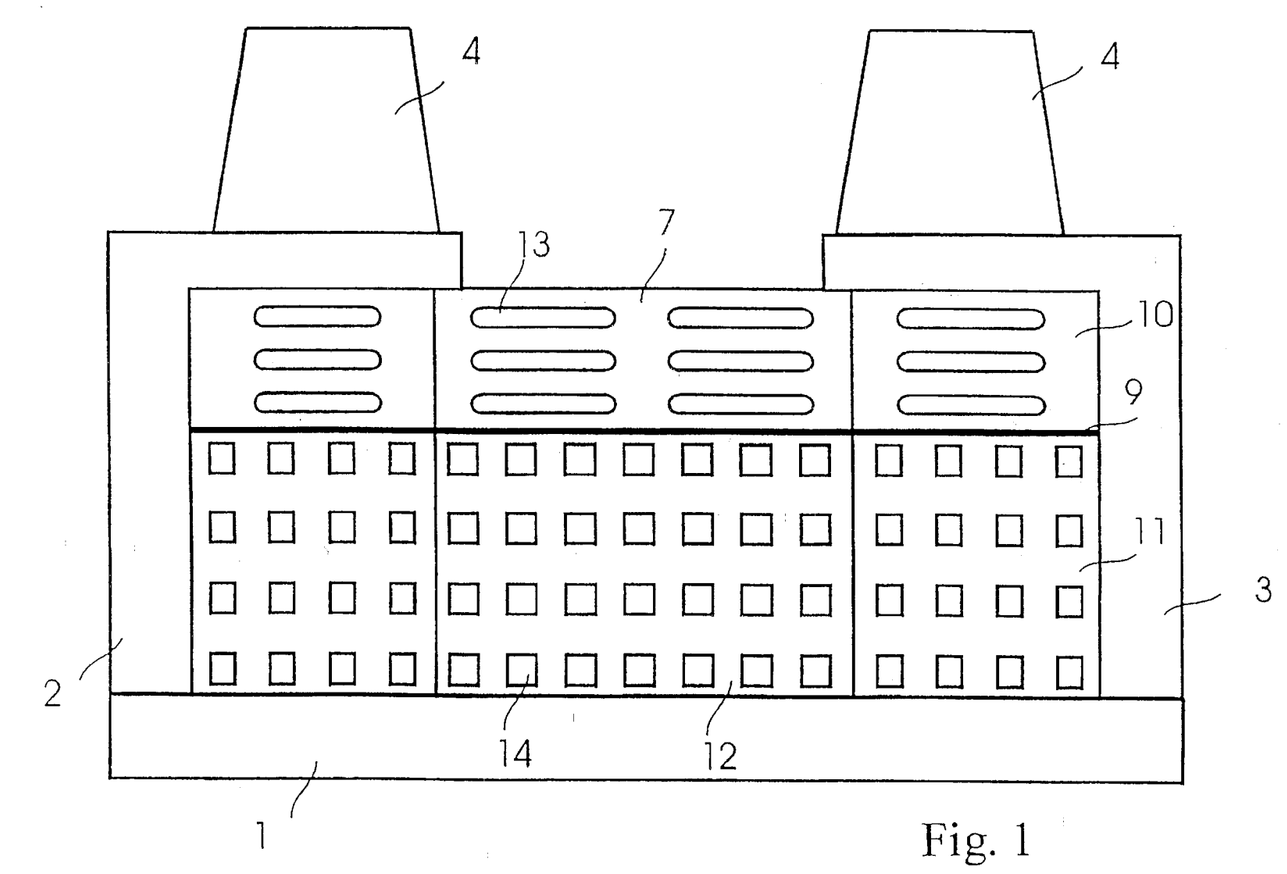
FIG. 1 shows a front view of a device for handling disk-shaped objects.
Figure 2:
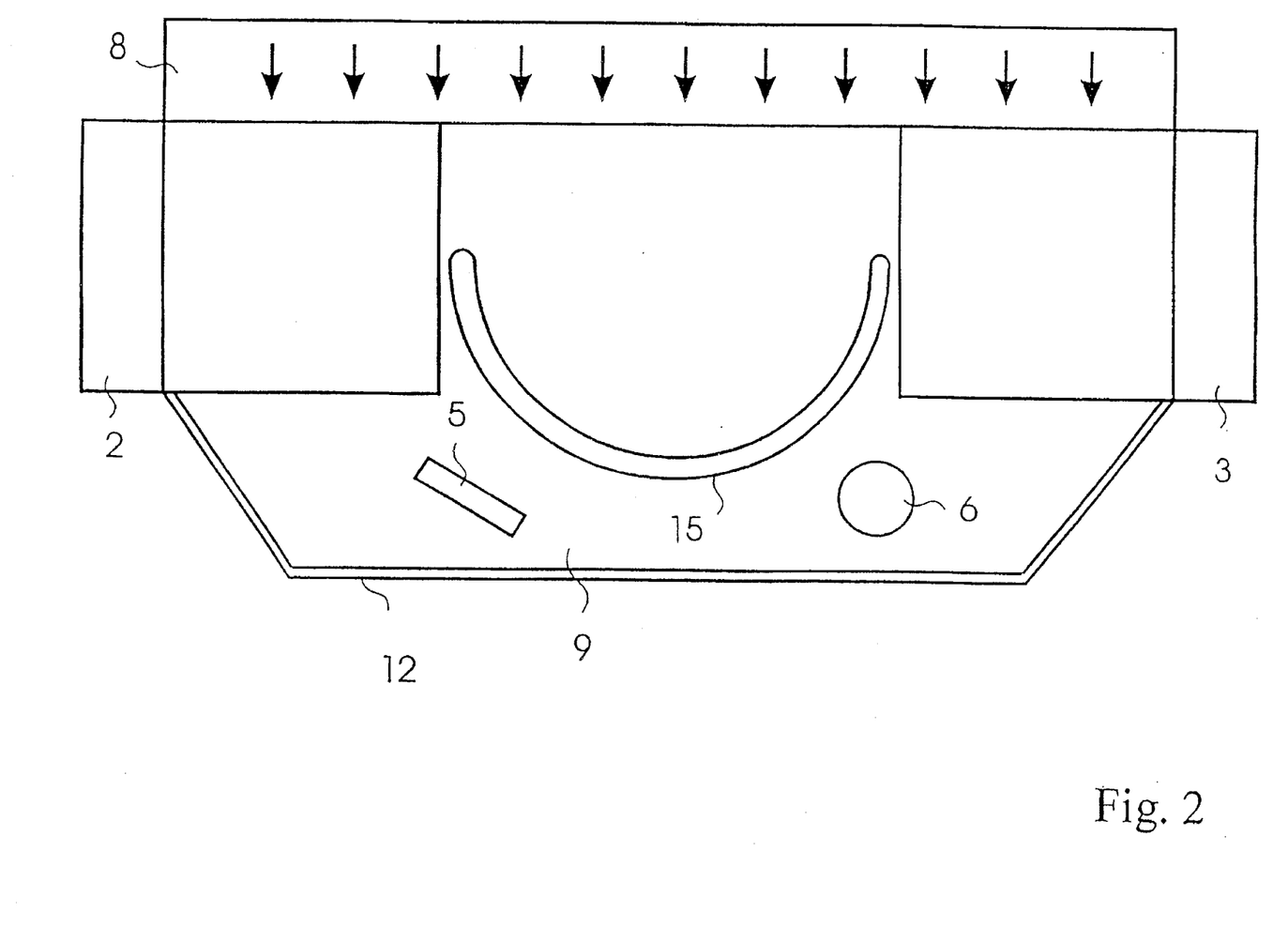
FIG. 2 shows a top view of the intermediate base in the device according to FIG. 1.

According to FIGS. 1 and 2, two devices 2, 3 for indexing magazines for disk-shaped objects are located opposite one another and are mounted on a carrier 1. Together with a manipulator, which is not shown in this drawing but is described more fully with reference to FIG. 11, and work stations 5, 6, e.g. a pre-aligner and a wobble table, the devices 2, 3 form a basic setup, according to the invention, which is enclosed by an enclosure 7. SMIF boxes placed on the latter are designated by 4. An air-processing system 8 provides for a laminar air flow of the requisite purity. Other work stations may include a bar code reader or an OCR reader. With respect to operation, the device is suitable as a visual inspection device, flat or notch finder, batch transfer device, loader or unloader, merger or splitter.

The enclosure 7 which is divided by an intermediate base 9 into two partial spaces 10, 11 has vents 13, 14 in its wall 12 which is located opposite the air-processing system 8 and outwardly defines the latter. These vents 13, 14 compensate for the overpressure which is produced.

A reduction in the overall cross section of vent 13 compared to the overall cross section of vent 14 results in an air flow component which is directed from the partial space 10 above the intermediate base 9 to the partial space 11 below the intermediate base 9. A cut out portion 15 for the manipulator and other openings (not shown) in the intermediate base 9 which are provided for the work stations 5, 6 guarantee an overflow of the air flow so that particles introduced below the intermediate base 9 by the drive elements which could adversely affect clean room conditions are prevented from penetrating into the partial space 10 devoted to handling, processing and inspection.

Figure 3:
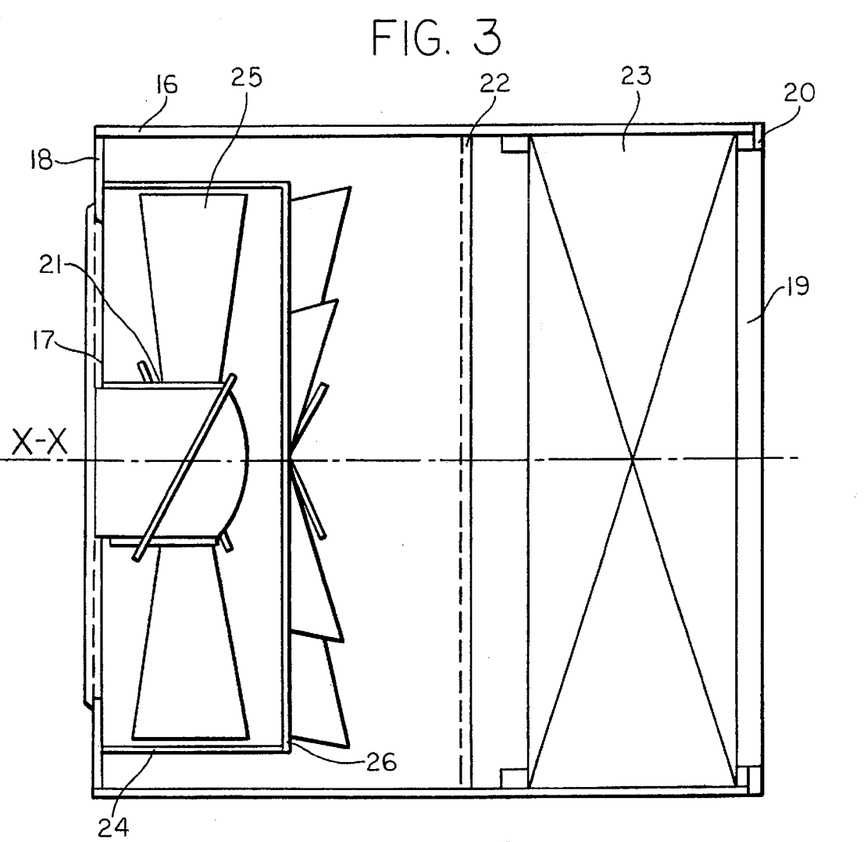
FIG. 3 shows an air-processing system.

In addition to containing an axial fan 21 arranged along an axis X—X which simultaneously forms the axis of rotation of the axial fan 21, a housing 16 having an inlet opening 17 in an inlet plate 18 and an outlet opening 19 in an outlet plate 20 also contains a sieve-like compensating device 22 and a high-efficiency particulate matter filter 23 which closes tightly with the side walls of the housing 16.

A tubular enclosure 24 which tightly contacts the inlet plate 18 at one side and is constructed as a pipe sleeve separates the inlet opening 17 and the axial fan 21 from the interior of the housing 16 with the exception of an air outlet in the direction of flow. The housing 16 serves at the same time as a plenum. The pipe sleeve is arranged at the smallest possible distance from the fan blades 25.

Figure 4:
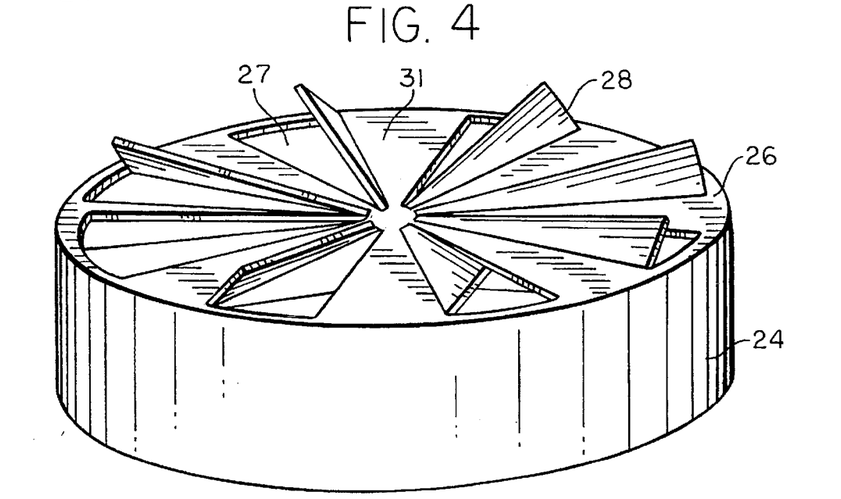
FIG. 4 is a perspective view of a possible arrangement of the air baffles.

The air outlet is formed by circle-sector-shaped cut outs 27 which are symmetrical with reference to the axis of rotation and are cut into a plate 26 connected with the pipe sleeve. The cut outs 27 have air guidance surfaces in the form of air baffles 28 situated within the flow of air generated by the axial fan 21. These air baffles 28 can project out from the plate 26 in the direction of the outlet plate 20, as shown in FIG. 4, and/or in the direction of the inlet plate 18.

The air baffles 28 are inclined relative to the plate 26 as determined by the type and construction of the axial fan. 21. A substantially parallel alignment relative to the fan blades 25 should be selected.

Naturally, air baffles which overlap in pairs because of their size can also be used, in which case the surface members 31 located between the cut outs 27 parallel to the high-efficiency particulate matter filter 23 can be dispensed with.

The flow of air which is sucked in via the inlet opening 17 by the axial fan 21 and blown in the direction of the outlet opening 19 has a component directed toward the outlet opening 19 and two components directed toward the side walls so that the resultant describes a twisting movement of the air flow. This twisting movement would cause an irregular flow against the filter plates at the high-efficiency particulate matter filter 23 preventing an advantageous exploitation of the effective filter surface so that the amount of pure air produced would decrease due to increased air resistance of the volume flow.

The air baffles 28 placed in the flow of air and acting against the twisting movement compensate for the components directed toward the side walls so that the available air flow now contains only the components directed toward the outlet opening 19.

The sieve-like compensating device 22 unifies the pressure of the air flowing against it. Air flows against the effective surface of the high-efficiency particulate matter filter 23 vertically and uniformly.

Figure 5:
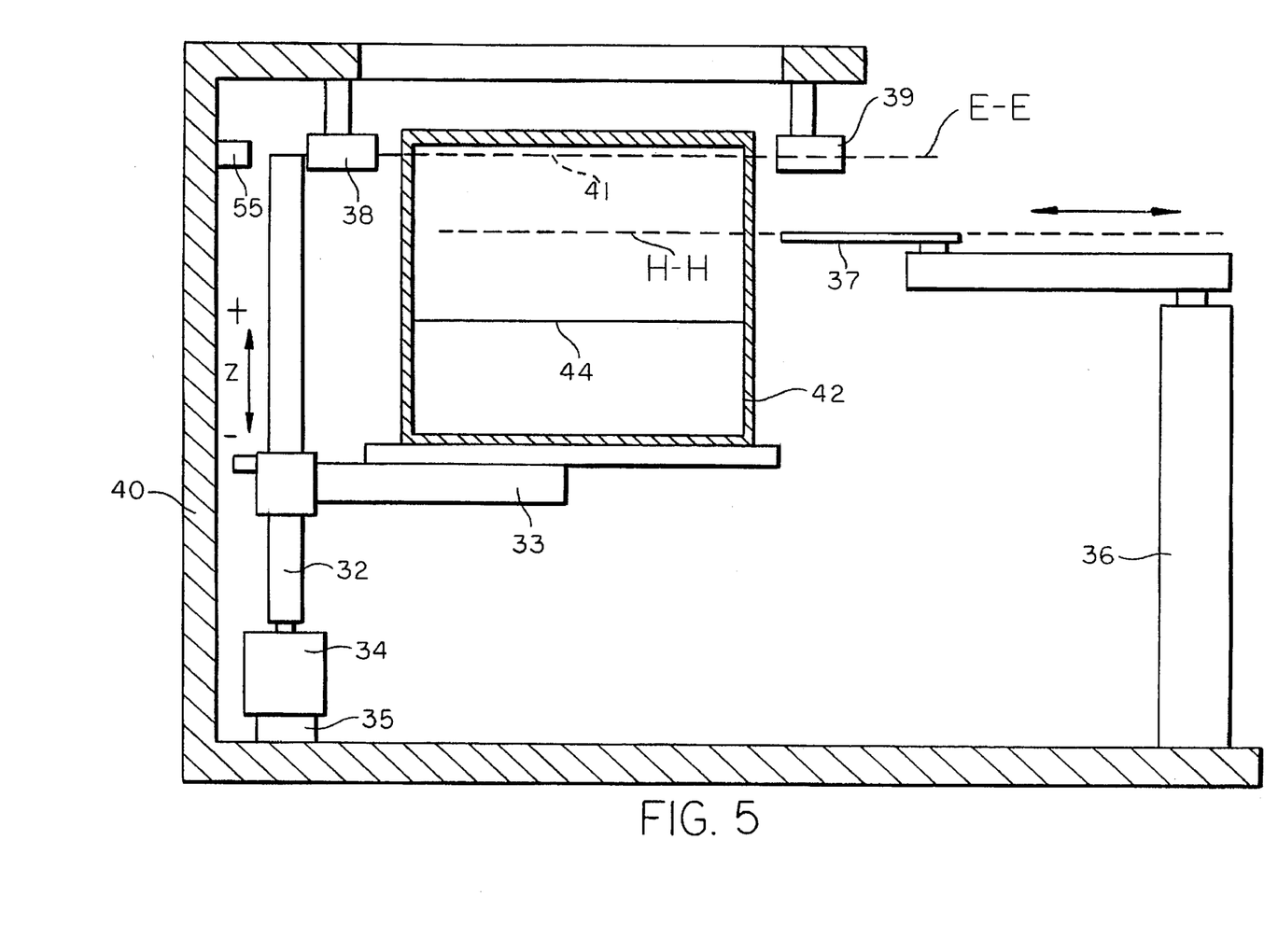
FIG. 5 is a view of an indexing device in partial section.

A device for indexing, only part of which is shown in FIG. 5, contains in its interior a magazine seat 33 which can be raised and lowered along the z axis (vertically to the supporting surface of the device) via a spindle 32. The spindle 32 is driven by a stepping motor 34 which is outfitted with an angle measuring system 35 so that the distance traversed when raising or lowering can be determined via the slope of the spindle.

Figure 10:
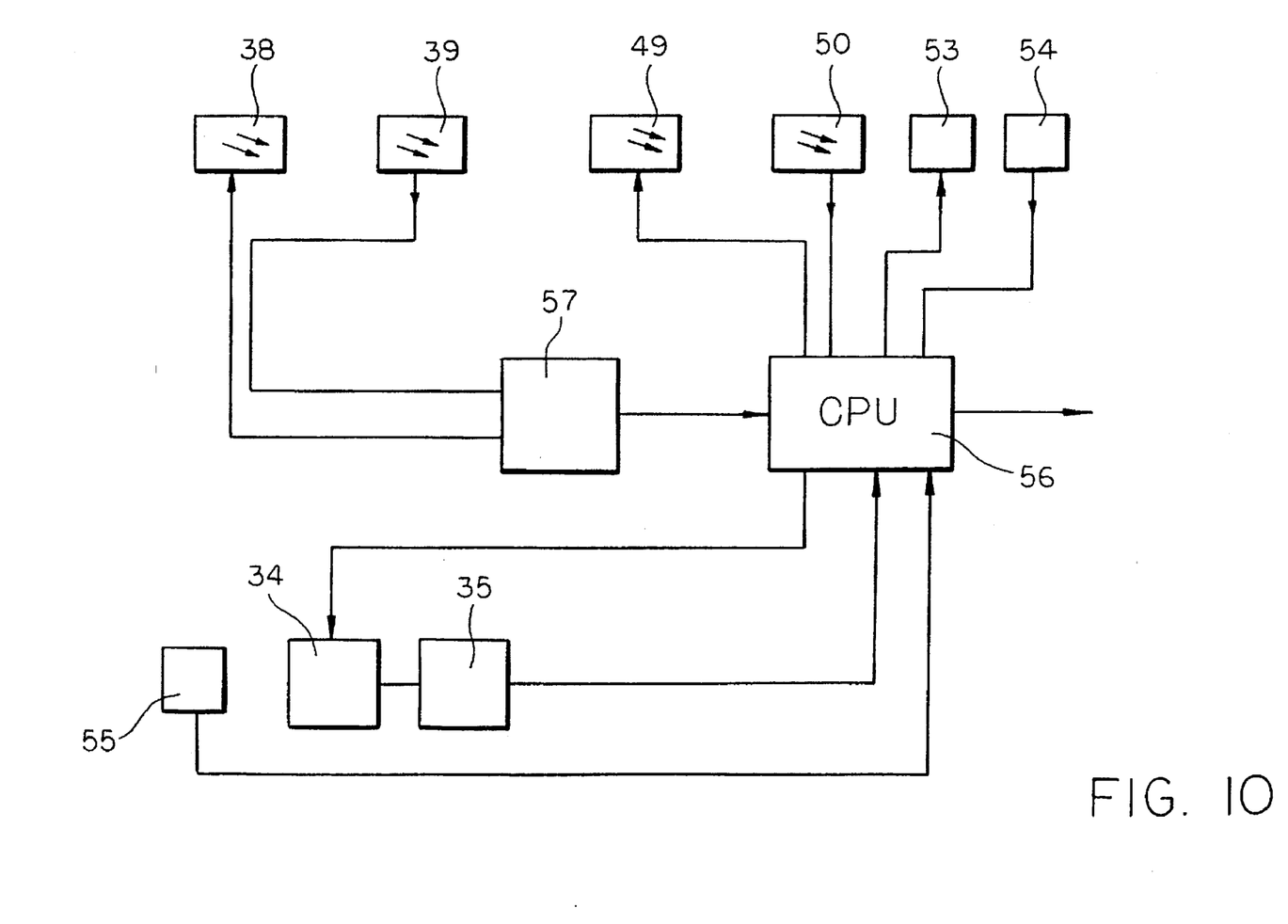
FIG. 10 is a block diagram showing the connection of the control unit, processing unit and evaluating unit with other units for carrying out indexing.

Together with a control computer 56 according to FIG. 10, the stepping motor 34 with its control electronics and angle measuring system 35 forms a position regulator of a magazine elevator which also comprises the spindle 32 and magazine seat 33. A manipulator 36 has a handling arm 37 working in a handling plane H—H and is fastened to a common frame 40 along with the magazine elevator and an optoelectronic sensor having a transmitter 38 and receiver 39. The transmitter 38 emits a bundle of measurement rays 41 whose center ray passes along a reference plane E—E for indexing magazine shelves 43 located in a magazine 42 and disk-shaped objects 44 contained therein. For the sake of simplicity, the magazine shelves 43 are not shown until FIG. 7. The distance between plane E—E and handling plane H—H can be selected within the range of movement of the spindle drive.

Figure 6:
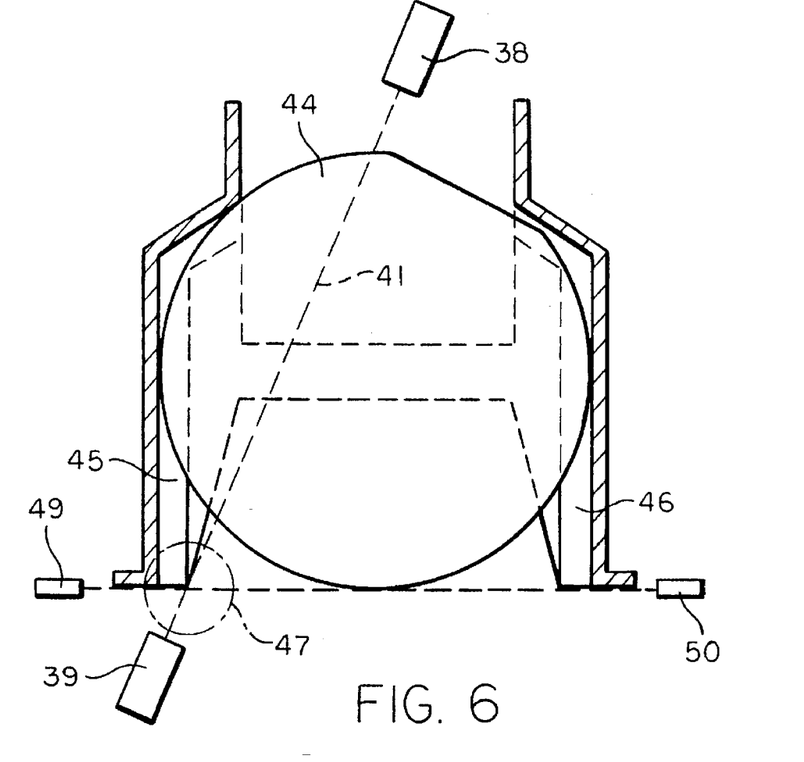
FIG. 6 shows the arrangement of an optoelectronic sensor in connection with a sectional view through the magazine.
Figure 7:
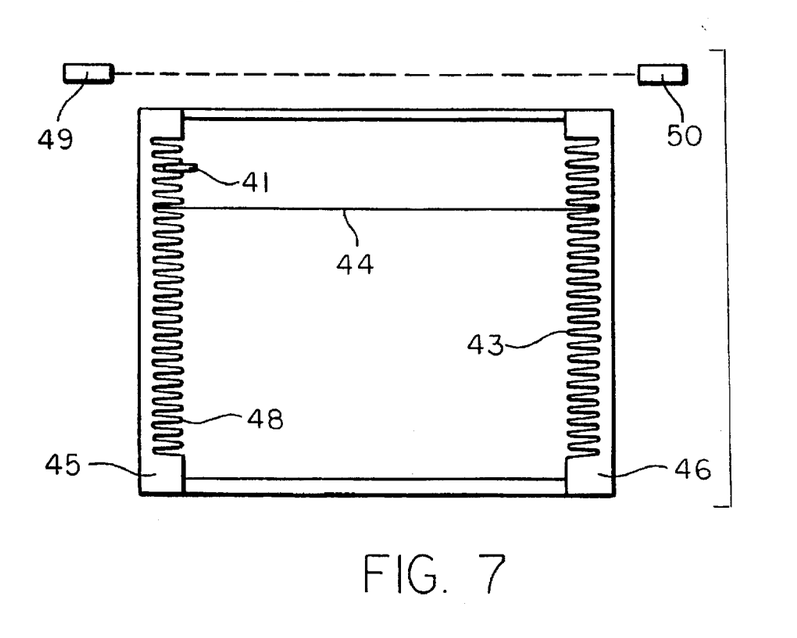
FIG. 7 shows the front view of a magazine with a cross-sectional view of a bundle of measurement rays.

FIGS. 6 and 7 show the arrangement of the sensor with reference to the magazine 42 and disk-shaped objects 44, e.g. semiconductor wafers or templates, which may be present in the magazine shelves 43. According to the drawing, transmitter 38 and receiver 39 are so situated that the bundle of measurement rays 41 is guided between walls 45, 46 of the magazine 42 and directed on a corner portion 47. According to FIG. 8, the corner portion 47 extends into the bundle of measurement rays 41 so far that projections 48 facing the interior of the magazine 42 and serving as supports for the disk-shaped objects 44 interrupt the bundle of measurement rays 41.

The oblique irradiation of the magazine 42 shown in the drawing was chosen because the magazine 42 is usually partially closed in the rear. In the absence of such closure, it would also be possible, of course, to guide the bundled measurement rays 41 parallel to the walls 45 and 46 and magazine shelves 43. The center ray of the bundle of measurement rays 41 advantageously passes directly along the front edge of the projections 48.

In addition to the first sensor, another sensor having a transmitter 49 and a receiver 50 is arranged next to the magazine 10 on its loading and unloading side (the side facing the manipulator 36). This sensor is situated at a defined distance from the first sensor and detects objects 51 protruding from the magazine 42 when the latter 42 is transported in the positive z direction.

Figure 9:
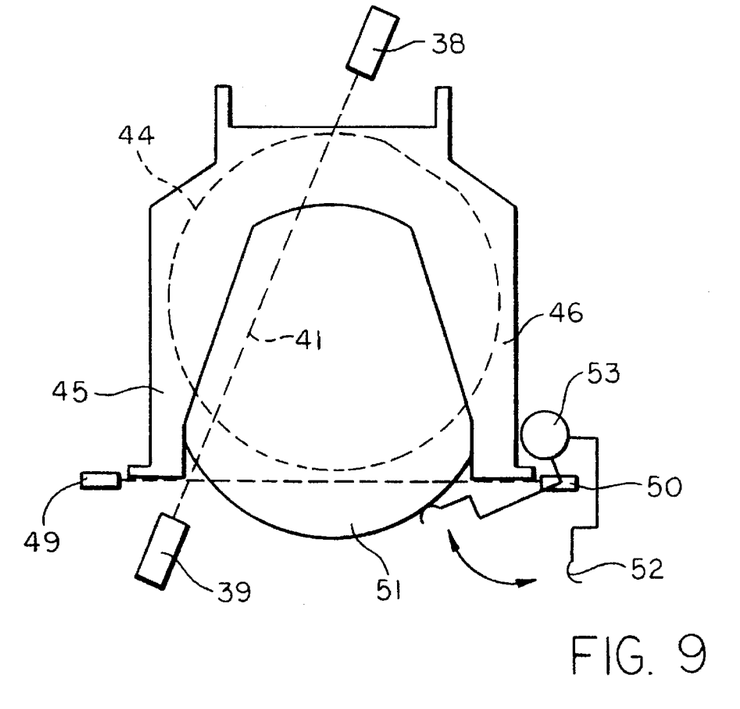
FIG. 9 shows a top view of the magazine with a second sensor and a wafer returning device.

As shown in FIG. 9, a wafer returning device 52 is provided for positioning the object 51 protruding from the magazine 42. The wafer returning device 52 takes over the displacement of the object 51 in the magazine 42 in a plane parallel to the first handling plane H—H on the basis of the position information obtained by the first sensor. Accordingly, transport of the magazine 42 can proceed without interference and without manual intervention.

The wafer returning device 52 comprises a lever mechanism 53 which is driven by an electric motor and executes a swiveling movement of 90° at each revolution of its drive (not shown). The reversal point of the lever of mechanism 53 is so disposed that it pushes the object 51 into the magazine 42 and then returns to an initial position which is monitored by a limit switch 54.

According to FIG. 10, the stepping motor 34, angle measuring system 35, transmitters 38 and 49, receivers 38 and 50, a third sensor 55 rigidly connected with the frame 40, the lever mechanism 53 and the limit switch 54 are connected with a control computer 56 as shown in the drawing for carrying out the invention. Analog-to-digital converters, only one of which 57 is shown in FIG. 10, are connected between the sensors and the control computer 56.

After the magazine seat 33 is positioned relative to the third sensor 55, which is rigidly connected with the frame 40 and situated at a known distance from the handling plane H—H and reference plane E—E, and after the counter of the angle measuring system is reset to zero, the magazine 42 is automatically removed by its base from a dust-proof transport container (SMIF box) and is taken over by the magazine seat 33 for indexing the magazine shelves 43 and disk-shaped objects 44 located therein. The magazine seat 33 is then lowered, i.e. moved in the negative z direction, until it exceeds a threshold value sw2. Threshold values sw1 and sw2 are advantageously determined for the purpose of data reduction. The distance of the base of the magazine 42 from the reference plane E—E is detected in this way.

Figure 8:
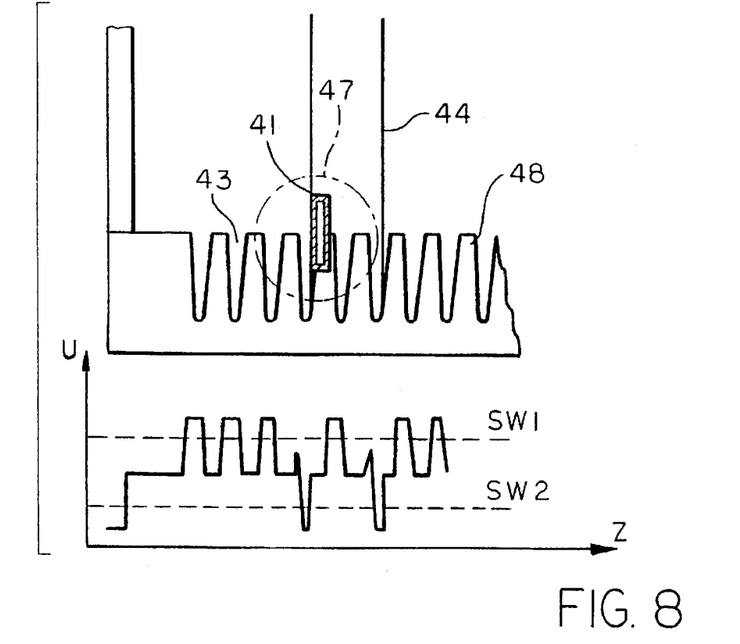
FIG. 8 shows, respectively, a section from one of the walls of the magazine with inserted disk-shaped objects and an image of the section sensed by the optoelectronic sensor.

As the magazine 42 moves through the measurement plane E—E in the direction of its shelves 43, which are located one above the other, an amplitude-modulated sensor output signal U representing the magazine shelves 43 and objects 44 as a map or image is obtained at the receiver 39 as a function of the distance corresponding to FIG. 8 and is fed to the A–D converter 57 and, via the control computer 56, combined with the measurement signal of the angle measuring system 35 and stored.

In order to remove an object 44 from the magazine 42 or to place it in an empty magazine shelf 43, a value for the distance between measurement plane E—E and the first handling plane H—H is added to the determined counter reading and the magazine 42 is moved into the corresponding z position by means of the magazine elevator.

Figure 11:
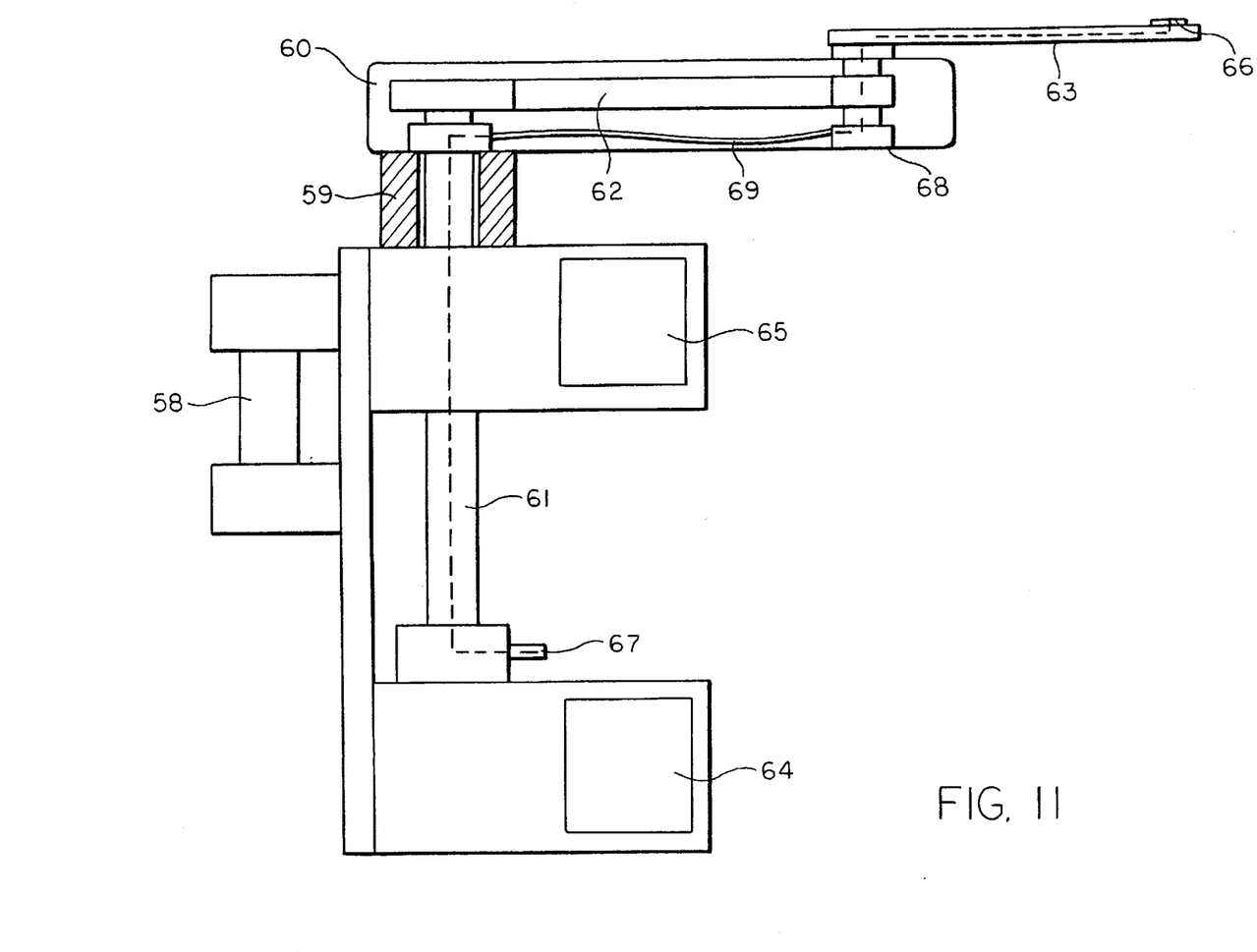
FIG. 11 shows a side view of a manipulator.

The manipulator shown in FIG. 11 which can be adjusted slightly in the z direction by a drive 58 in order to lift the disk-shaped objects and corresponds to the manipulator 36 shown in FIG. 5 is constructed as a two-member articulated arm and has an upper arm 60 connected with a hollow axle 59 and a lower arm 63. The lower arm 63 is supported in the upper arm 60 via an axle 68 which is connected by a toothed belt 62 with an inner axle 61. The axles 59, 61 are driven by motors 64, 65, respectively, which are preferably constructed as stepping motors. To achieve the required positioning accuracy, the motors 64, 65 which are provided with an angle measuring system are coupled to the axles 59, 61 by means of a high-reduction transmission.

A vacuum holding device 66 for the disk-shaped objects which is provided at the lower arm 63 is directly connected to a vacuum controlled within the axles 61 and 68. A vacuum connection between the axles 61 and 68 is formed via a vacuum line 69. An interface to a vacuum pump (not shown) is designated by 67 and realized by a rigid connection. Accordingly, there is no need for a movable line to supply the vacuum.

While the foregoing description and drawings represent the preferred embodiments of the present invention, it will be obvious to those skilled in the art that various changes and modifications may be made therein without departing from the true spirit and scope of the present invention.

We claim:

1. A device for handling disk-shaped objects in a handling plane of a local clean room, said device comprising:

work stations situated substantially in the handling plane for processing and inspecting the disk-shaped objects;

an air processing system for generating a substantially laminar air flow, said air processing system being positioned on a side of said device;

a magazine which can be adjusted vertically relative to the handling plane and work station by a plurality of drive elements;

an intermediate base dividing the local clean room into two partial spaces, a first partial space and a second partial space; and means for generating an air flow component from said substantially laminar air flow and directing said airflow component from said first partial space on one side of said intermediate base into said second partial space on the other side of said intermediate base;

wherein (i) said laminar air flow is introduced separately into said first and second partial space from said side on which said air processing system is positioned and (ii) a direction of said air flow component is substantially perpendicular to a direction of said laminar air flow.

2. The device according to claim 1, wherein said means for generating said air flow component and directing said airflow component from said first partial space to said second partial space comprises a wall toward which the substantial laminar air flow generated by said air processing system is directed, said wall (i) being, located opposite said air processing system, (ii) defining an outer surface of said clean room, and (iii) having air outlet openings which communicate with said first and second partial spaces, where an overall cross section of said openings which communicate with said first partial space is smaller than an overall cross section of said openings which communicate with said second partial space.

3. The device according to claim 2, wherein said air-processing system contains an axial fan and a filter arranged in series in the direction of the substantially laminar flow, said fan and filter being positioned between an inlet opening and an outlet opening in a common housing serving as a plenum, the inlet opening and axial fan being separated by a tubular enclosure from the plenum while leaving open an air outlet in the direction of the flow, and wherein the air outlet contains air guidance surfaces which are situated in the air flow and act against rotational components of the air flow.

4. The device according to claim 3, wherein the air outlet comprises circle-sector-shaped cut outs which are cut into a plate connected with the enclosure so as to be symmetrical to a rotational axis of the axial fan, the air guidance surfaces being placed in these cut outs so as to be directed parallel to the fan blades of the axial fan.

5. The device according to claim 1, further comprising an indexing means for indexing shelves of magazines containing the disk-shaped objects, wherein (i) the handling plane is in a fixed relationship with a reference plane of said indexing means, (ii) said indexing means is includes a magazine seat as a component part for indexing shelves of magazines; and (iii) said indexing means is positioned within said first partial space.

6. The device according to claim 5, wherein said indexing means includes an optoelectric sensor having a transmitter and a receiver and which detects a position of the magazine shelves and disk-shaped objects relative to the reference plane by measuring techniques.

7. The device according to claim 6, wherein said transmitter emits a bundle of measurement rays whose center is oriented in the reference plane, said bundle of rays being guided between oppositely located walls containing the magazine shelves and directed on and interrupted by projections of one of the walls, which projections face toward an interior of the magazine and form shelves supporting the disk-shaped objects, and wherein as a result of the vertical adjustment in a direction of the magazine shelves which are located one above the other and which accordingly successively occupy a position in common with the reference plane, an image of the magazine shelves and of the disk-shaped objects located therein is produced by modulating the bundle of measurement rays.

8. The device according to claim 7, further including: a wafer returning means for positioning disk-shaped objects protruding from the magazine, said wafer returning means having an action depending on a sensor signal of a second sensor whose bundle of measurement rays is directed parallel to the disk-shaped objects and directly adjoins a side of the magazine used for loading and unloading during vertical adjustment of the magazine.

9. The device according to claim 8, wherein handling of said disk-shaped object is carried out by a manipulator with an articulated arm, said manipulator comprising (i) a plurality of members with rotating axles which are hollow axles and (ii) a front member with a vacuum holding device for picking up the disk-shaped objects by a vacuum present in the hollow axles.

10. A device for handling disk-shaped objects in a handling plane of a local clean room, said device comprising:

work stations situated substantially in the handling plane for processing and inspecting the disk-shaped objects;

an air processing system for generating a substantially laminar air flow;

a magazine which can be adjusted vertically relative to the handling plane and work station by a plurality of drive elements;

an intermediate base dividing the local clean room into two partial spaces, a first partial space and a second partial space; and means for generating an air flow component from said substantially laminar air flow and directing said airflow component from said first partial space on one side of said intermediate base into said second partial space on the other side of said intermediate base, wherein said means for generating said air flow component and directing said airflow component from said first partial space to said second partial space comprises a wall toward which the substantial laminar air flow generated by said air processing system is directed, said wall (i) being located opposite said air processing system, (ii) defining an outer surface of said clean room, and (iii) having air outlet openings which communicate with said first and second partial spaces, where an overall cross section of said openings which communicate with said first partial space is smaller than an overall cross section of said openings which communicate with said second partial space.

11. The device according to claim 10, wherein said air-processing system contains an axial fan and a filter arranged in series in the direction of the substantially laminar flow, said fan and filter being positioned between an inlet opening and an outlet opening in a common housing serving as a plenum, the inlet opening and axial fan being separated by a tubular enclosure from the plenum while leaving open an air outlet in the direction of the flow, and wherein the air outlet contains air guidance surfaces which are situated in the air flow and act against rotational components of the air flow.

12. The device according to claim 11, wherein the air outlet comprises circle-sector-shaped cut outs which are cut into a plate connected with the enclosure so as to be symmetrical to a rotational axis of the axial fan, the air guidance surfaces being placed in these cut outs so as to be directed parallel to the fan blades of the axial fan.

13. A device for handling disk-shaped objects in a handling plane of a local clean room, said device comprising:

work stations situated substantially in the handling plane for processing and inspecting the disk-shaped objects;

an air processing system for generating a substantially laminar air flow;

a magazine which can be adjusted vertically relative to the handling plane and work station by a plurality of drive elements;

an intermediate base dividing the local clean room into two partial spaces, a first partial space and a second partial space; and means for generating an air flow component from said substantially laminar air flow and directing said airflow component from said first partial space on one side of said intermediate base into said second partial space on the other side of said intermediate base, wherein said means for generating said airflow component includes air outlet openings which communicate with said first and second partial spaces, where an overall cross section of said openings which communicate with said first partial space is smaller than an overall cross section of said openings which communicate with said second partial space.

* * * * *